United States Patent
Liao et al.

(10) Patent No.: US 8,637,972 B2
(45) Date of Patent: Jan. 28, 2014

(54) TWO-SIDED SUBSTRATE LEAD CONNECTION FOR MINIMIZING KERF WIDTH ON A SEMICONDUCTOR SUBSTRATE PANEL

(75) Inventors: Chih-Chin Liao, Changhua (TW); Ning Ye, San Jose, CA (US); Cheemen Yu, Madison, WI (US); Jack Chang Chien, Koashiung (TW); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 533 days.

(21) Appl. No.: 11/760,405

(22) Filed: Jun. 8, 2007

(65) Prior Publication Data

US 2008/0303166 A1 Dec. 11, 2008

(51) Int. Cl.
*H01L 23/48* (2006.01)
*H01L 23/52* (2006.01)

(52) U.S. Cl.
USPC ........... 257/691; 257/692; 257/698; 257/773; 257/786; 257/E23.079

(58) Field of Classification Search
USPC ........... 257/773, 777, E23.01, 691, 692, 698, 257/786, E23.079
See application file for complete search history.

(56) References Cited

U.S. PATENT DOCUMENTS

| | | | |
|---|---|---|---|
| 5,467,252 A | 11/1995 | Nomi et al. | |
| RE36,773 E * | 7/2000 | Nomi et al. | 361/760 |
| 6,281,047 B1 | 8/2001 | Wu et al. | |
| 6,319,750 B1 | 11/2001 | Huang et al. | |
| 6,392,291 B1 * | 5/2002 | Corisis | 257/678 |
| 6,479,887 B1 * | 11/2002 | Yoon et al. | 257/666 |
| 7,064,419 B1 * | 6/2006 | Bayan et al. | 257/666 |
| 7,087,986 B1 | 8/2006 | Bayan et al. | |
| 7,098,524 B2 | 8/2006 | Wu et al. | |
| 7,235,864 B2 | 6/2007 | Lee | |
| 2002/0074650 A1 * | 6/2002 | Takahashi et al. | 257/723 |
| 2002/0145178 A1 * | 10/2002 | Tsao et al. | 257/620 |
| 2002/0145517 A1 | 10/2002 | Papallo, Jr. et al. | |
| 2003/0150110 A1 * | 8/2003 | Kang et al. | 29/846 |
| 2005/0051881 A1 * | 3/2005 | Chen et al. | 257/678 |
| 2007/0132066 A1 * | 6/2007 | Takiar et al. | 257/620 |
| 2007/0155247 A1 | 7/2007 | Takiar et al. | |
| 2007/0267759 A1 | 11/2007 | Liao et al. | |

FOREIGN PATENT DOCUMENTS

| | | |
|---|---|---|
| EP | 0757381 A1 | 2/1997 |
| KR | 1019980020175 A | 6/1998 |
| KR | 1020060009087 A | 1/2006 |
| TW | 200739861 | 10/2007 |

OTHER PUBLICATIONS

Office Action dated Oct. 6, 2008 in U.S. Appl. No. 11/301,715.
International Search Report and Written Opinion dated Dec. 24, 2008 in PCT Application No. PCT/US2008/066100.
Office Action dated Feb. 20, 2009, U.S. Appl. No. 11/760,385.

(Continued)

*Primary Examiner* — Nitin Parekh
(74) *Attorney, Agent, or Firm* — Vierra Magen Marcus LLP

(57) ABSTRACT

A semiconductor die substrate panel is disclosed including a minimum kerf width between adjoining semiconductor package outlines on the panel, while ensuring electrical isolation of plated electrical terminals. By reducing the width of a boundary between adjoining package outlines, additional space is gained on a substrate panel for semiconductor packages.

30 Claims, 6 Drawing Sheets

(56) References Cited

OTHER PUBLICATIONS

Response to Office Action filed Feb. 6, 2009, U.S. Appl. No. 11/301,715.
Response to Office Action filed May 20, 2009 in U.S. Appl. No. 11/760,035.
Office Action dated Jun. 26, 2009 in U.S. Appl. No. 11/301,715.
Notice of Allowance and Fee(s) Due dated Jul. 20, 2009 in U.S. Appl. No. 11/760,385.
Communication Relating to the Results of the Partial International Search dated Jul. 7, 2007 in PCT Application No. PCT/US2006/047206.
U.S. Appl. No. 11/760,385, filed on Jun. 8, 2007.
Response to Office Action filed Oct. 26, 2009 in U.S. Appl. No. 11/301,715.
Office Action dated Jan. 6, 2010, U.S. Appl. No. 11/301,715.
Response to Office Action filed Apr. 6, 2010, U.S. Appl. No. 11/301,715.
Office Action dated Apr. 2, 2010 in Taiwanese Application No. 095146479.
Office Action dated Jul. 7, 2010, U.S. Appl. No. 11/301,715.
Response to Office Action filed Jun. 29, 2010 in Taiwanese Application No. 095146479.
Office Action dated Dec. 1, 2010 in Chinese Application No. 200880019350.5.
Office Action mailed Mar. 30, 2011 in U.S. Appl. No. 11/301,715.
Response to Office Action filed Apr. 17, 2011 in Chinese Application No. 200880019350.5.
Office Action dated Apr. 18, 2011 in Korean Application No. 10-2010-7000149.
Response to Office Action mailed Feb. 8, 2011 in U.S. Appl. No. 11/301,715.
Notice of Allowance and Fee(s) Due dated Jan. 30, 2013 in U.S. Appl. No. 11/301,715.
Response to Office Action filed Jul. 18, 2011 in Korean Application No. 10-2010-7000149.
Response to Office Action filed Aug. 1, 2011 in U.S. Appl. No. 11/301,715.
Search Report dated Sep. 3, 2011 in Taiwanese Patent Application No. 097121311.
English Abstract and Bibliographic Information for TW200739861 published Oct. 16, 2007.
Final Office Action dated Feb. 28, 2012 in U.S. Appl. No. 11/301,715.
Response to Final Office Action filed Oct. 1, 2012 in U.S. Appl. No. 11/301,715.

* cited by examiner

TWO-SIDED SUBSTRATE LEAD CONNECTION FOR MINIMIZING KERF WIDTH ON A SEMICONDUCTOR SUBSTRATE PANEL

CROSS-REFERENCE TO RELATED APPLICATION

The following application is cross-referenced and incorporated by reference herein in its entirety:

U.S. patent application Ser. No. 11/760,385, entitled "Method Of Minimizing Kerf Width On A Semiconductor Substrate Panel," by Chih-Chin Liao, et al., filed on Jun. 8, 2007, now published as Publication No. 2008/0305577A1.

BACKGROUND OF THE INVENTION

1. Field of the Invention

Embodiments of the present invention relate to a semiconductor die substrate panel including a minimum kerf width between adjoining semiconductor package outlines on the panel, while ensuring electrical isolation of plated contacts.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid, dielectric base having a conductance pattern, generally of copper or copper alloy, etched on respective sides. Electrical connections are formed between the die and the conductance pattern(s), and the conductance patterns(s) provide an electric lead structure for communication between the die and an external electronic system. Once electrical connections between the die and substrate are made, the assembly is then typically encased in a molding compound to form a protected semiconductor package.

While the copper conductance patterns may be etched to high precision, the poor corrosion properties of copper make it undesirable for certain applications. In the presence of moisture, air and chlorine, bare copper is readily tarnished, making it unsuitable for subsequent soldering and die attach operations. Similarly, certain packages, such as land grid array (LGA) and ball grid array (BGA) packages include contact fingers formed on a lower surface of the package and exposed outside of the package for establishing electrical connection between the package and an external electronic device. If the contact fingers were formed of bare copper, tarnishing and corrosion would damage the fingers over time.

It is therefore known to plate copper leads at their solder or through-hole points, and at the contact fingers. Various plating processes are known for applying a thin film of resistive material, such as tin, tin-lead, nickel, gold and nickel-gold. In one such process, a resistive material such as gold may be selectively plated onto the conductance pattern in an electroplating process. Referring to prior art FIG. 1, an electroplating process may result in a plurality of gold plating tails 20 on a substrate 22. The plating tails 20 may terminate at solder pads 24, through-holes 26, and contact fingers 28 provided for external electrical communication. Not all of the plating tails 20, pads 24 and fingers 28 are numbered in FIG. 1. Plating tails 20 and solder pads 24 shown in dashed lines in FIG. 1 are located on the underside of substrate 22. The substrate 22 further includes plating bars 30 for shorting together the various tails 20, pads 24, through-holes 26 and fingers 28 during the electroplating process.

In performing the electroplating process, the substrate 22 is immersed in a plating bath including metal ions in an aqueous solution. A current is supplied to the plating bars 30, which current travels through the plating tails 20, pads 24, through-holes 26 and fingers 28. When the current is delivered, the tails 20, pads 24, through-holes 26 and fingers 28 are electrified and a charge is created at their surface. The metal ions are attracted to the electrified and charged metal areas. In this way, a layer of gold or other plating metal of a desired thickness may be deposited.

After electroplating, the plating bar 30 is removed. It is important that the entire plating bar 30 is removed. However, owing to engineering tolerances, the blade, router or other device cutting the substrate and removing the plating bar may shift up, down, left and/or right off of the desired cutting line. Engineering tolerances of for example 50 microns (μm) are common. When removing the plating bar, if for example a sliver or portion of the plating bar is left due to a shift of the cutting device, as shown in prior art FIG. 2, this may result in certain tails being shorted together, such as for example tails 20a, 20b and 20c, and a malfunctioning of the integrated circuit formed thereby.

In order to prevent this, a cutting blade, router or other device 32 used to remove the plating bar is provided with a large width, w, as shown in prior art FIG. 3. Ideally, the width of the removal device 32 would be no larger than the width of the plating bar, which may for example be approximately 3 to 5 mils. However, engineering tolerances require that the blade be made wider to ensure that, if the removal device 32 shifts up/down or left/right while removing the plating bar, the entire plating bar is still removed. For example, if the removal device (shown in dashed lines in FIG. 3) varies a distance, Δ, from a desired removal path, the removal device must still have a width large enough to completely remove the plating bar.

As a result of the large width of the removal device required, as well as the space required on either side of the plating bar for engineering tolerances in the removal process, a relatively large kerf width, k (FIGS. 1 and 3), must be provided around each plating bar. Conventional kerf widths may be approximately 250 μm or larger. This large kerf width takes up space on substrate 22 which could otherwise be used for the circuit portion of the substrate.

It is known to also plate substrates in an electroless plating process which does not employ plating bars. In electroless plating, metal ions in an aqueous solution are deposited on a conductance pattern by a chemical reducing agent in solution instead of an electric charge. However, such electroless processes suffer from disadvantages including high expense and an inability to achieve precise patterning on the substrate.

SUMMARY OF THE INVENTION

Embodiments of the invention relate to a semiconductor die substrate panel including a minimum kerf width between adjoining semiconductor package outlines on the panel, while ensuring electrical isolation of plated electrical terminals. The substrate panel may be formed with a plating bar between adjoining package outlines on the panel. The substrate panel may further include plated electrical terminals, such as solder pads and contact fingers, and plating tails electrically coupling the electrical terminals to the plating bar.

Each package outline may have electrical terminals which connect to plating bars on only two sides of the package outline. Moreover, instead of the plating bars being positioned within the center of the kerf between adjoining package outlines, the plating bars are positioned off-center within the kerf. In particular, the plating bars are positioned closer to the package outlines to which they are not electrically coupled. A plating bar is spaced away from a package outline to which it is coupled a distance sufficient to ensure that the plating bar is severed from the plating tails connected thereto during the cutting process. This distance may vary depending on engineering tolerances and other factors.

Having the plating lines connected on only one side and spaced from the package outline to which it is connected provides an advantage that the kerf width between adjoining package outlines may have a thinner width than known in the prior art. First, as it is not necessary to remove the plating bar, the width of the cutting device need not be greater than the width of the plating bar. Second, because portions of the plating bar pass across the boundary between adjoining package outlines, even if the path of the cutting device varies from straight due to engineering tolerances, the cut will still sever the plating bar between adjoining package outlines to isolate the electrical terminals.

By reducing the width of the boundary between adjoining package outlines in accordance with the present invention, additional space is gained on a substrate panel for semiconductor packages. For example, a fraction of a package outline may be turned into a whole package outline. The addition of even a single row and/or column of semiconductor packages from a given size panel would result in a tremendous increase in semiconductor package yields.

DETAILED DESCRIPTION

Embodiments of the invention will now be described with reference to FIGS. 4 through 11, which relate to a semiconductor die substrate including a minimum kerf width cut between adjoining semiconductor package outlines on the panel, while ensuring electrical isolation of plated contacts. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
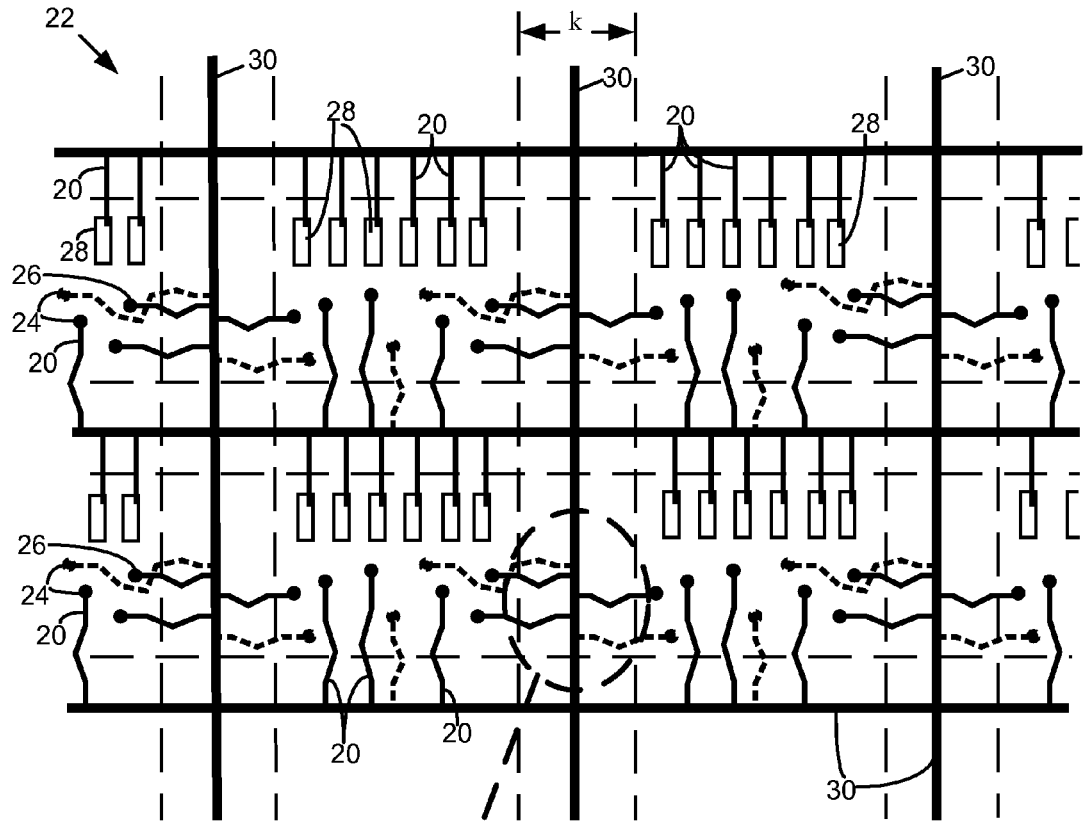
FIG. 1 is a prior art top view of a semiconductor die substrate including a plurality of package outlines and a conventional grid of plating bars.
Figure 2:
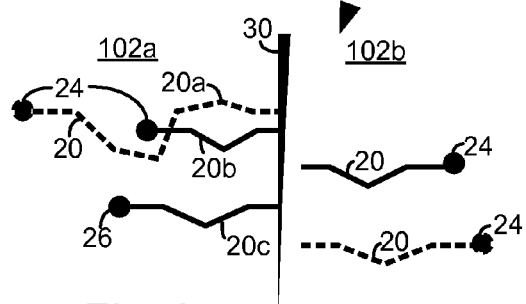
FIG. 2 is a prior art top view of a section of a semiconductor die substrate including a partially removed section of a plating bar.
Figure 3:
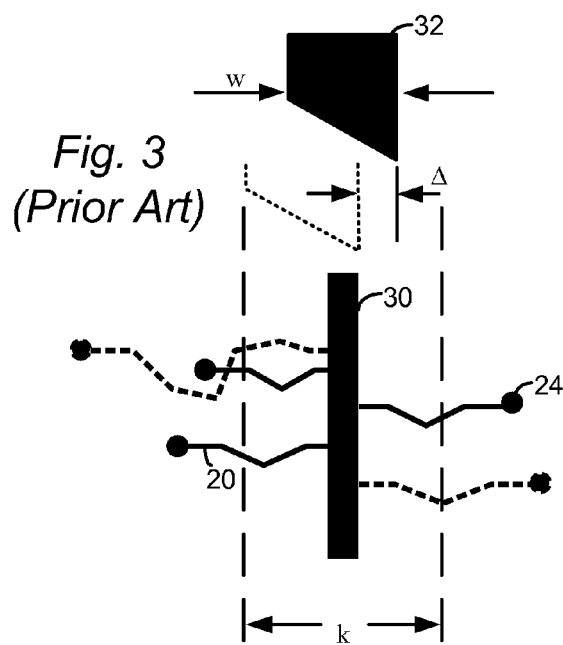
FIG. 3 is a prior art top view of a section of a semiconductor die substrate showing a kerf width required for a conventional plating bar removal device.
Figure 4:
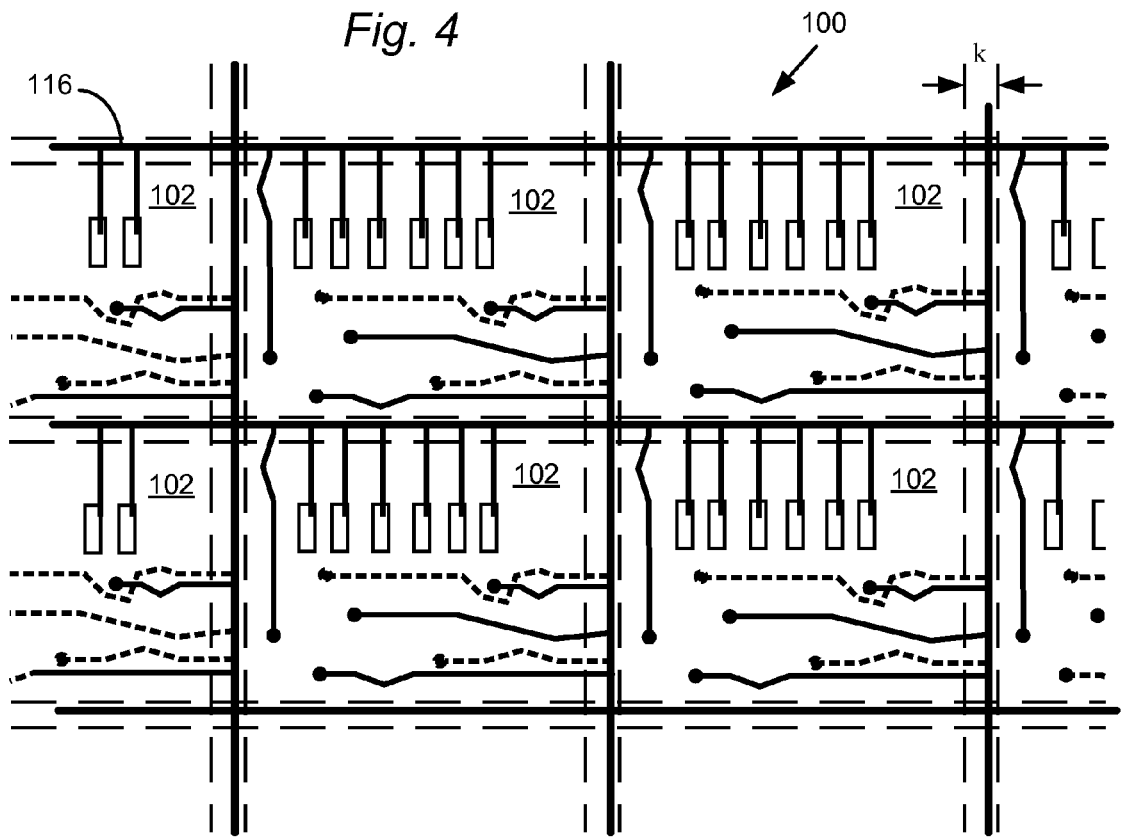
FIG. 4 is a top view of a semiconductor die substrate panel including a plurality of package outlines and a grid of plating bars according to an embodiment of the present invention.

Referring initially to the top view of FIG. 4, there is shown a substrate panel 100 including a plurality of package outlines 102. The package outlines define locations for the formation of the respective semiconductor packages on the substrate panel. The package outlines 102 may or may not be visibly discernible on the substrate panel 100.

Substrate panel 100 may be formed of a core, having a top and bottom conductive layer. The core may be formed of various dielectric materials such as for example, polyimide laminates, epoxy resins including FR4 and FR5, bismaleimide triazine (BT), and the like. Although not critical to the present invention, the core may have a thickness of between 40 μm to 200 μm, although thickness of the core may vary outside of that range in alternative embodiments. The core may be ceramic or organic in alternative embodiments.

The conductive layers may be formed of copper or copper alloys, plated copper or plated copper alloys, Alloy 42 (42Fe/58Ni), copper plated steel, or other metals and materials known for use on substrates. The layers may have a thickness of about 10 μm to 24 μm, although the thickness of the layers may vary outside of that range in alternative embodiments. One or both of the conductive layers may be etched in a known photolithography process with a conductance pattern for signal and power communication.

Figure 5:
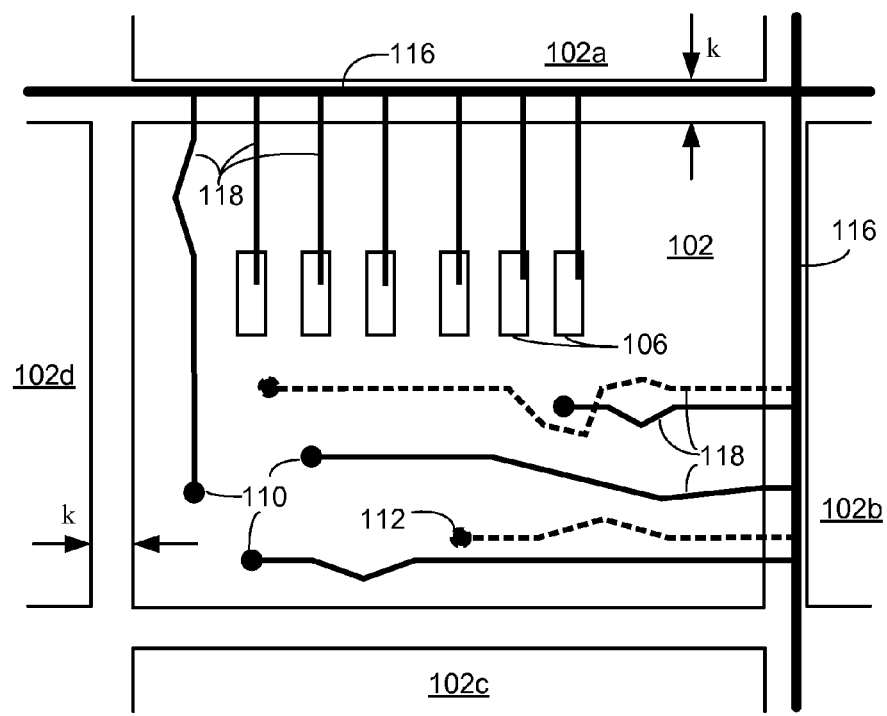
FIG. 5 is a top view of a package outline on the substrate panel of FIG. 4 according to an embodiment of the present invention.

FIG. 5 illustrates a single package outline 102 from FIG. 4, together with the plating bars 116 to which electrical leads within the illustrated package outline 102 connect. The conductance pattern on one side of the substrate panel 100 may include contact fingers 106 for establishing electrical connection between the finished semiconductor package and an external electronic device (in either an LGA or BGA format). The conductance pattern on one or both sides of the substrate panel 100 may include solder pads 110 where electrical contacts for surface mounted components such as semiconductor die are soldered to the substrate panel. Through-holes 112 may further be defined in the substrate panel 100 for electrical communication between the conductance patterns on opposed surfaces of the substrate panel. The conductance pattern on one or both sides of the substrate panel 100 may further include plating tails 118 used in a plating process as explained hereinafter.

Figure 11:
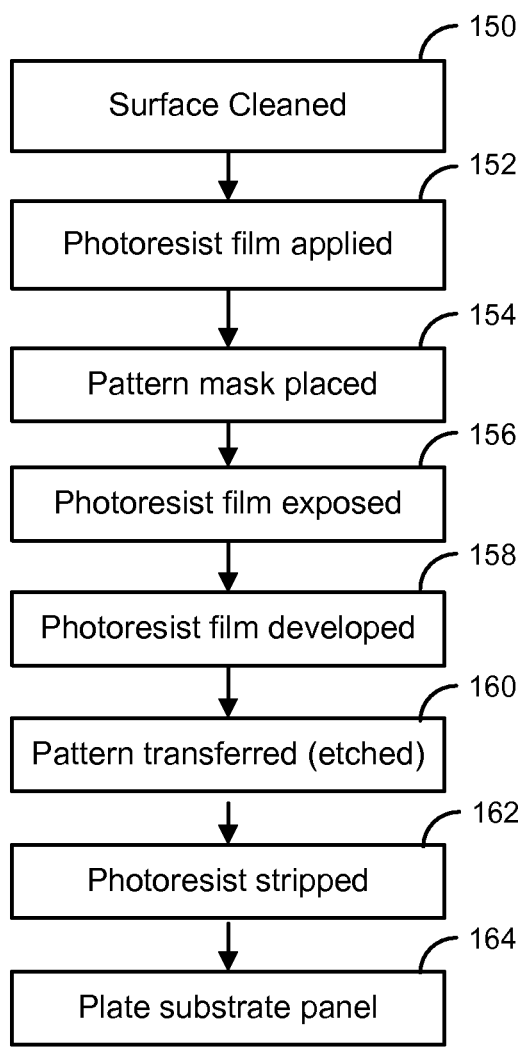
FIG. 11 is a flowchart for forming a conductance pattern and plating on the substrate panel.

One process for forming the conductance patterns including contact fingers 106, solder pads 110, through-holes 112, plating bars 116 and plating tails 118 on the substrate panel 100 is explained with reference to the flowchart of FIG. 11. The surfaces of the conductive layers are cleaned in a step 150. A photoresist film is then applied over the surfaces of the conductive layers in step 152. A pattern mask containing the outline of the electrical conductance pattern may then be placed over the photoresist film in step 154. The photoresist film is exposed (step 156) and developed (step 158) to remove the photoresist from areas on the conductive layers that are to be etched. The exposed areas are next etched away using an etchant such as ferric chloride in step 160 to define the conductance patterns on the core. Next, the photoresist is removed in step 162. Other known methods for forming the conductance pattern on substrate panel 100 are contemplated.

In step 164, after formation of the conductance pattern on one or both surfaces of the substrate panel 100, a layer of resistive metal may be plated on the electrical terminals of one or both conductance patterns on the substrate panel. In particular, electrical terminals of the conductance pattern that are to be plated may be shorted together, and those electrical terminals are electrically isolated from other portions which are not to be plated. The electrical terminals of the conductance pattern may include the contact fingers 106, solder pads 110 and through-holes 112. It may include only one or more of these in alternative embodiments. The electrical terminals are shorted together via the plating bars 116 and plating tails 118 formed on the substrate. Not all of the solder pads, through-holes and contact fingers are numbered in package outline 102 in FIG. 5. Plating tails 118 and solder pads 110 shown in dashed lines in FIGS. 4 and 5 are located on the underside of the substrate panel. Moreover, the panel 100 may include more solder pads, through-holes and/or contact fingers than shown. Although not shown, some of the electrical terminals may be formed electrically coupled to each other, and the electrical coupling between terminals subsequently broken to isolate each terminal in a known etch-back process.

The electrical terminals of the conductance pattern may be plated with a metal film, such as for example gold, in a known manner. Other metals, including tin, tin-lead, nickel and nickel-gold may be plated onto the conductance pattern(s) in alternative embodiments. The width of the plating bars 116 may be determined by a known formula, but may be between 3 mils and 5 mils. The plating bars may be thinner or thicker than that in alternative embodiments.

In one embodiment of a process for plating the substrate panel 100, the panel may be immersed in a plating bath including metal ions in an aqueous solution. A current is then supplied to the plating bars 116, which current travels through the plating bars 116, through the tails 118 and to the solder pads 110, through-holes 112 and/or contact fingers 106. When the current is delivered, plating bars 116, tails 118, pads 110, through-holes 112 and fingers 106 are electrified and a charge is created at their surface. The metal ions are attracted to the electrified and charged metal areas. A thin film of metal is thus plated onto the shorted areas of the conductance pattern. The thickness of the plated film may vary, but in embodiments may be between 10 µm and 50 µm, though it may be thinner or thicker than that in alternative embodiments. Other known methods for electroplating a metal film on the conductance pattern(s) may be used in alternative embodiments.

In the embodiment shown in FIGS. 4 and 5, all areas to be plated are shorted together. It is understood that two or more of the areas to be plated may be electrically isolated from each other. In such embodiments, current may be provided to each such shorted area. In such embodiments, it may also be possible to obtain different plating film thicknesses by applying more current, or the same current for longer periods of time, in some areas relative to other areas. Thus, for example, it may be possible to obtain thicker plating at the contact fingers than at the solder pads and through-holes. It is also known that the contact fingers may be plated with two layers: one soft gold layer and one hard gold layer to enhance the performance of the contact fingers. One layer may be used on the contact fingers in embodiments.

After plating of the substrate is complete, each of the electrical terminals must be electrically isolated from each other. As explained in the Background of the Invention section, this was done conventionally by ensuring removal of the plating bar with a wide cutting device, with the result of a wide kerf width between package outlines. In accordance with embodiments of the present invention, the plating bar 116 is not necessarily removed, but is instead severed from the plating tails 118 to ensure that each of the electrical terminals is electrically isolated from each other.

In one embodiment shown in FIG. 4 and the enlarged view of FIG. 5, each package outline may have electrical terminals which connect to plating bars 116 on only two sides of the package outline 102. Moreover, instead of the plating bars being positioned within the center of the kerf between adjoining package outlines, the plating bars are positioned off-center within the kerf. In particular, the plating bars are positioned adjacent package outlines they do not connect with, and are spaced away from package outlines having terminals to which the plating bar is connected.

Thus, for example in FIG. 5, the plating bar 116 positioned between package outlines 102 and 102*a* is coupled to terminals within package outline 102 and is not coupled to terminals in package outline 102*a*. The plating bar between package outlines 102 and 102*a* is positioned adjacent to package outline 102*a* and spaced from package outline 102. Similarly, the plating bar 116 positioned between package outlines 102 and 102*b* is coupled to terminals within package outline 102 and is not coupled to terminals in package outline 102*b*. The plating bar between package outlines 102 and 102*b* is positioned adjacent to package outline 102*b* and spaced from package outline 102. Although not shown, a plating bar that is coupled to terminals within package outline 102*c* may be positioned between package outlines 102 and 102*c* adjacent to package outline 102, and a plating bar that is coupled to terminals within package outline 102*d* may be positioned between package outlines 102 and 102*d* adjacent to package outline 102.

A plating bar 116 is spaced away from a package outline to which it is coupled a distance sufficient to ensure that the plating bar is severed from the plating tails 118 connected thereto during the cutting process. This distance may vary depending on engineering tolerances and other factors. However, in embodiments, the plating bars 118 may be shifted between 125 µm and 50 µm, and more particularly about 100 µm, away from the package outline to which it is coupled. It is understood that the plating bars may be shifted more or less than the amounts set forth above in alternative embodiments. It is contemplated that the horizontal plating bar 116 coupled to a package outline 102 may be spaced from the package outline 102 the same amount, or a different amount, in comparison to the vertical plating bar 116 coupled to that package outline.

Figure 6:
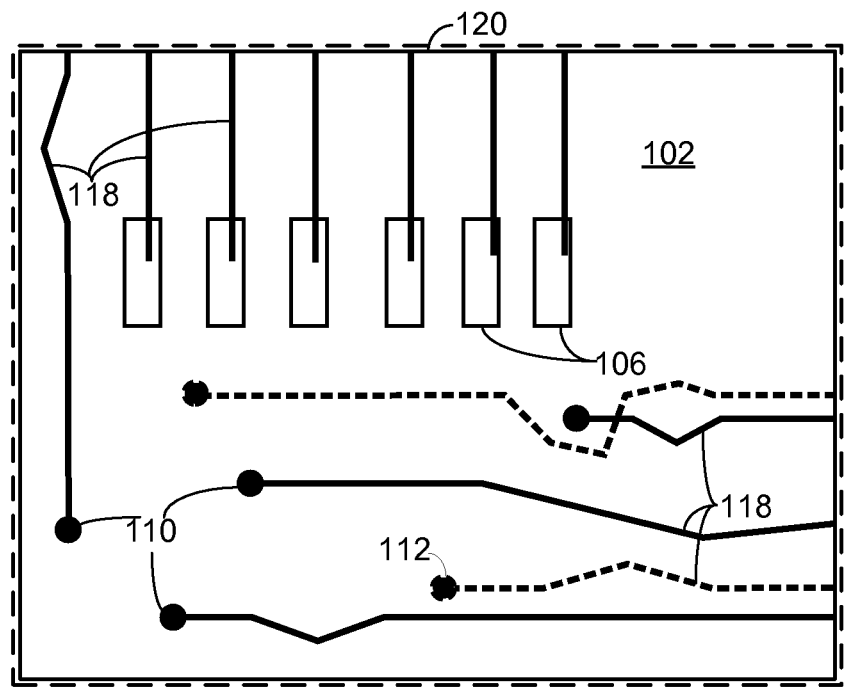
FIG. 6 is a top view of a package outline cut from the panel with the cut line generally conforming to the package outline.

Referring now to FIG. 6, there is shown a package outline 102 which has been cut (by methods explained hereinafter) along dashed line 120. In this example, there is no improper shifting during the cutting of the package outline, and the cut is made properly around the periphery of the package outline.

However, as indicated in the Background section, owing to engineering tolerances, a cutting device may shift during a cut so as not cut precisely along the periphery of the package outline. For example, in FIG. 7, the cut has shifted upward by an amount $\Delta_1$, and shifted left (with respect to the view shown in FIG. 7) by an amount $\Delta_2$. Because the plating bars coupled to electrical terminals within the package outline 102 are shifted away from the package outline 102 by an amount greater than the tolerance of the cutting system, the horizontal plating bar above the package (not shown) is still outside of the cut line even though the cut is shifted upwards. The same would true if the cut were shifted to the right of the package outline 102 shown in FIG. 7.

Figure 7:
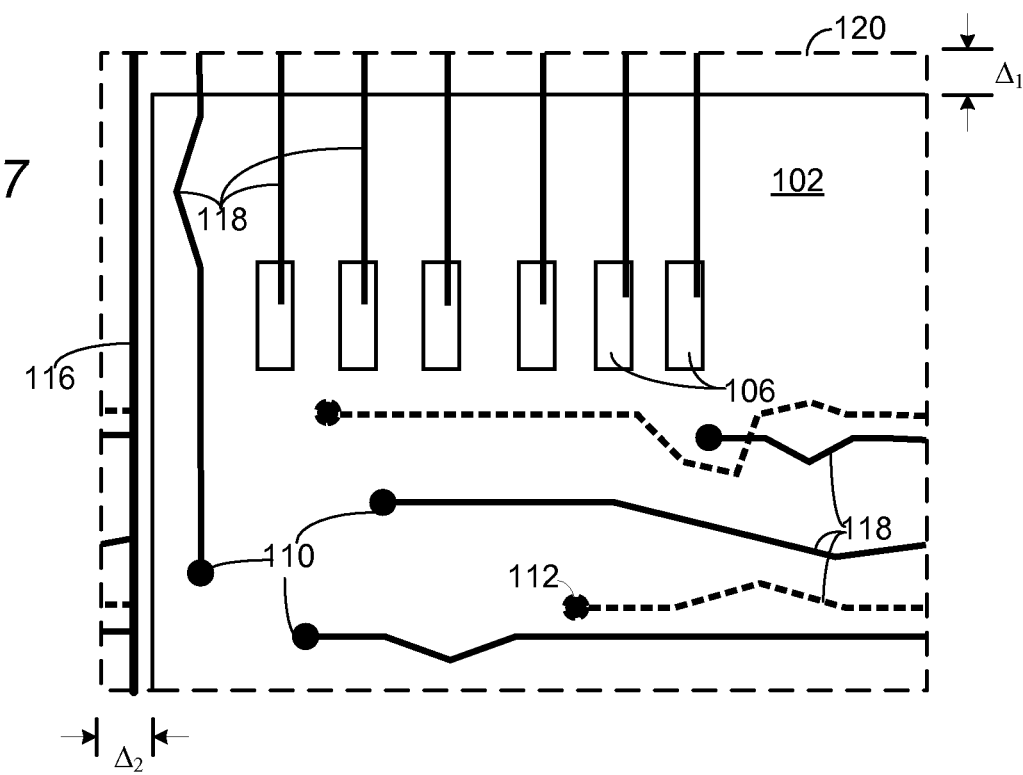
FIG. 7 is a top view of a package outline cut from the panel with the cut line generally not conforming to the package outline.

Due to the shift $\Delta_2$ of the cut to the left, the plating bar 116 on the left and adjacent to the package outline 102 shown in FIG. 7 is included within the cut. However, as the plating bar 116 shown does not couple to any of the electrical terminals in the package outline 102 shown, no electrical shorting of electrical terminals occurs in the package outline 102 shown. The portion of plating bar 116 shown may remain harmlessly within the semiconductor package to be formed using the package outline 102. The same would true if the cut were shifted to the downward from that shown in FIG. 7. Moreover, the cut along the left edge of the package outline 102 will sever and electrically isolate the electrical terminals in any adjacent package outline to the left of the package outline 102 shown.

Having a plating bar spaced from a package outline to which it is coupled provides an advantage that the kerf width, k (FIG. 5), between adjoining package outlines may have a thinner width than known in the prior art. First, as it is not necessary to remove the plating bar, the width of the cutting device need not be greater than the width of the plating bar, and in fact may be thinner than the width of the plating bar. Second, because the plating bar is spaced away from its coupled package outlines by a distance exceeding tolerances, even if the path of the cutting device varies from straight due to engineering tolerances, the cut will still sever the plating bar from the electrical terminals to isolate the electrical terminals.

Thus, the kerf width between adjoining package outlines may be reduced because the width of the cutting device may be made smaller and the space previously required for engineering tolerances may be omitted. In embodiments, this allows a kerf width of approximately 100 µm to 225 µm, or alternatively 150 µm to 200 µm, and more particularly about 175 µm. It is understood that the kerf width may be wider or smaller than this in alternative embodiments. In an embodiment where the kerf width is 175 µm, a plating bar may be located in a kerf between first and second package outlines 25 µm from the first package outline where the plating bar is coupled to terminals in the second package outline. It is understood in the above example that the plating bar may be closer or further than 25 µm in alternative embodiments. In embodiments, the plating line may be located within the first package outline where the plating bar is coupled to terminals in the second package outline.

The size of the substrate panel is generally selected by the semiconductor package manufacturer, and the size of the substrate panel is not typically selected for a particular number of package outlines. The size is set, and then as many package outlines as will fit on that size are provided. If the density of package outlines is maximized on a given size substrate panel, it rarely works out that a whole number of package outlines fit on the substrate panel. Instead, maximizing the density results in a given number of whole package outlines, and fractions of package outlines at the side and bottom edges. For example, a substrate panel may fit 10 package outlines across a length of the panel with a fraction of a package outline left over. Obviously, a fraction of a semiconductor package cannot be fabricated. Thus, conventionally, in this example, 10 such packages would be formed on the substrate panel, and the 10 are spread out across the length of the panel (i.e., the boundary between packages is increased).

However, by reducing the boundary between adjoining package outlines in accordance with the present invention, a panel having 10 such boundaries may reclaim enough space to complete the 11 package outline, thus allowing a column of semiconductor packages to be added. The addition of even a single row and/or column of semiconductor packages within a given size panel would result in a tremendous increase in package yields.

Figure 8:
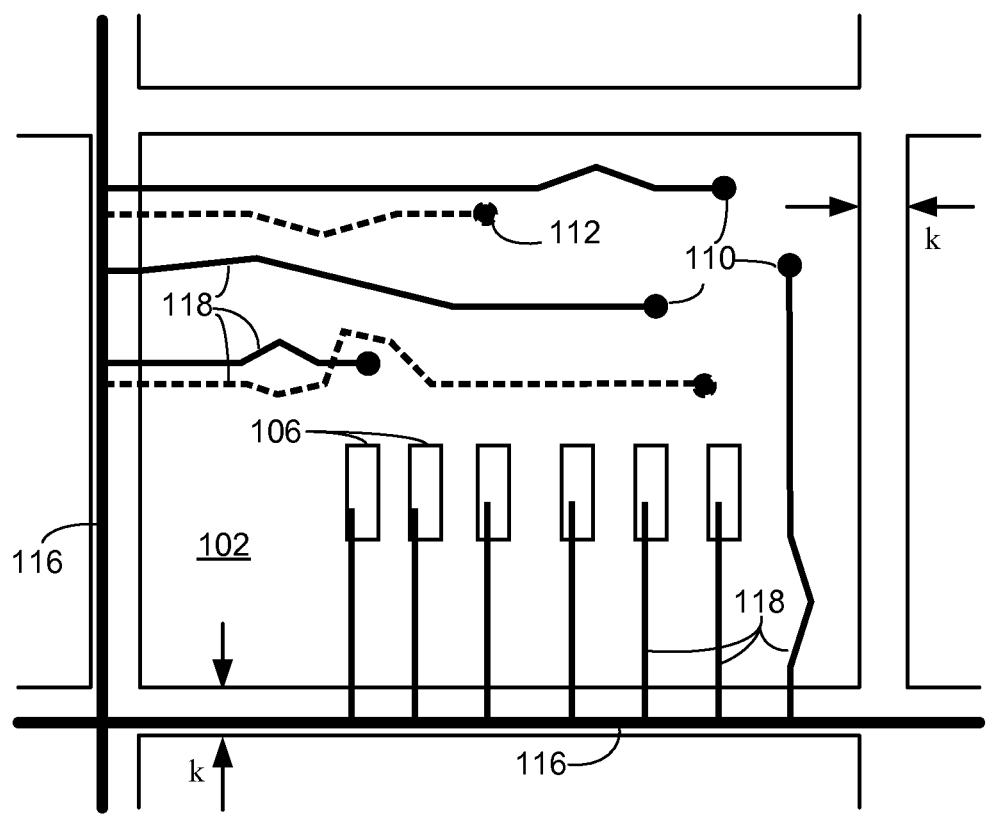
FIG. 8 is a top view of a package outline according to an alternative embodiment of the present invention.

While the plating bars 116 shown in FIGS. 4-7 are shifted up and to the right relative to the centerline of the kerf between package outlines 102 on panel 100, it is understood that the plating bars may be positioned elsewhere with respect to the kerf. For example, FIG. 8 shows the plating bars shifted down and to the left relative to the centerline of the kerf. Moreover, the plating bars according to the present invention need not comprise only straight lines on panel 100. It is contemplated that a single plating line 116 and both horizontal and vertical components while being positioned as described above.

As used herein and as explained in greater detail below, the term "cut" may refer to separating package outline 102 from the panel, or the term "cut" may instead refer to severing the plating bar without cutting through the substrate. In embodiments, after the plating process, the plating bar 116 may remain intact for the remainder of the semiconductor package. Once the panel is encapsulated as explained hereinafter, the panel may be singulated into individual semiconductor packages. In such embodiments, the plating bars may be cut when the packages are singulated. The packages may be singulated, and the plating bars cut, by a variety of severing methods used to singulate semiconductor packages.

Sawing is generally less expensive, less time consuming and requires less equipment than other cutting methods, and may be used to singulate the semiconductor packages. However, it is understood that the panel 100 may be singulated by a variety of cutting methods in alternative embodiments, such as for example, water jet cutting, laser cutting, water guided laser cutting, dry media cutting, and diamond coated wire. Water can also be used together with laser cutting to help complement or focus its effects. While the semiconductor packages are shown as square or rectangular, they may additionally or alternatively have irregular or curvilinear shapes in alternative embodiments. A further description of the cutting of semiconductor packages from a panel and the shapes which may be achieved thereby is disclosed in published U.S. Application No. 2004/0259291, entitled, "Method For Efficiently Producing Removable Peripheral Cards," which application is assigned to the owner of the present invention and which application has been incorporated by reference herein in its entirety.

In embodiments, after the plating process, the plating bars 116 may be cut without cutting through the substrate panel 100. A router may be used to sever the plating bar 116 without cutting through the substrate panel as is known in the art.

Figure 9:
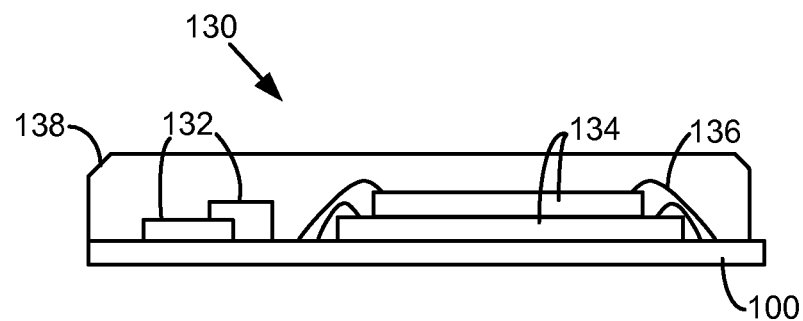
FIG. 9 is a cross-sectional side view of a semiconductor package formed with a substrate from a panel having a plating bar according to an embodiment of the present invention.

A substrate panel 100 including plating bars, tails and electrical terminals as described above may be formed into a plurality of semiconductor packages 130, one of which is shown in FIG. 9. After plating of the conductance patterns on the substrate panel 100, one or more passive devices 132 and semiconductor die 134 may be mounted on the substrate panel. Although not critical to the present invention, the semiconductor die 134 may a flash memory chip (NOR/NAND), SRAM or DDT, and/or a controller chip such as an ASIC. Other silicon chips are contemplated.

The one or more die 134 may be electrically connected to the substrate panel 100 by wire bonds 136 soldered at the plated solder pads 110 in a known wire bond process. Thereafter, the substrate and die may be encased within a molding compound 138 in a known encapsulation process to form a finished semiconductor die package 130. The molding compound may be applied according to various processes, including by transfer molding or injection molding techniques, to encapsulate the package. Once encapsulated, the individual package outlines 102 may be singulated from the panel into the individual semiconductor packages 130. If the plating lines had not already been severed, they are severed during the singulation of the packages from the panel.

Figure 10:
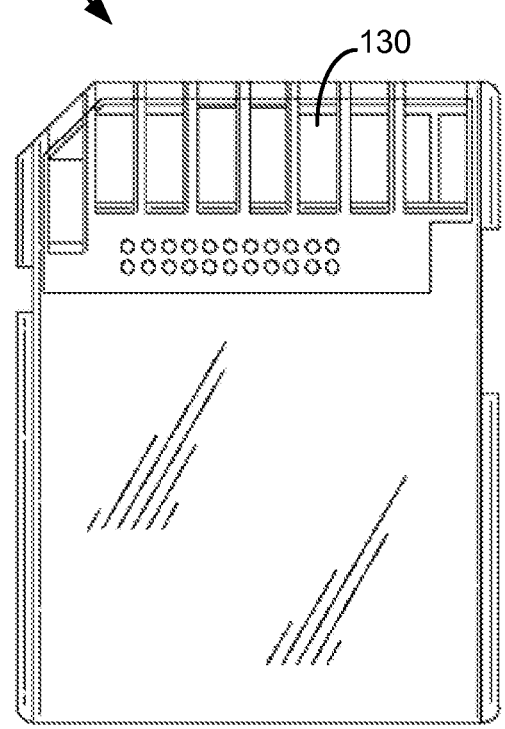
FIG. 10 is a rear view of a flash memory formed with the semiconductor package of FIG. 9.

FIG. 10 is a rear view of a flash memory device 140 in which the semiconductor package 130 may be used. The flash memory device may be an SD Card, a Compact Flash, a Smart Media, a Mini SD Card, an MMC, an xD Card, a Transflash or a Memory Stick. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A substrate panel for fabricating semiconductor packages, the substrate panel including a plurality of package outlines defining locations for formation of semiconductor packages, the substrate panel comprising:
   a first package outline of the plurality of package outlines, the first package outline including electrical terminals;
   a second package outline of the plurality of package outlines, the second package outline including electrical terminals and being adjacent to the first package outline; and
   a plating bar adjacent to the first package outline on a first side of the plating bar and adjacent the second package outline on a second side of the plating bar, the plating bar being electrically coupled to the electrical terminals in the first package outline and not those in the second package outline, the plating bar being positioned closer to the second package outline.

2. A substrate panel as recited in claim 1, wherein the plating bar is sufficiently distant from the second package outline to prevent electrical shorting together of two or more electrical terminals through the plating bar due to tolerances in a process for cutting the coupling between the plating bar and the electrical terminals.

3. A substrate panel as recited in claim 1, wherein the plating bar is more than 50 μm away from a centerline between the first and second adjacent package outlines.

4. A substrate panel as recited in claim 1, wherein the plating bar is 25 μm or less away from the first package outline.

5. A substrate panel as recited in claim 4, wherein the kerf width between the first and second package outlines is between 100 μm and 225 μm.

6. A substrate panel as recited in claim 1, wherein the kerf width between the first and second package outlines is between 100 μm and 225 μm.

7. A substrate panel as recited in claim 1, wherein the kerf width between the first and second package outlines is between 150 μm and 200 μm.

8. A substrate panel as recited in claim 1, wherein the kerf width between the first and second package outlines is approximately 175 μm.

9. A substrate panel as recited in claim 1, wherein the first and second groups of electrical terminals comprise at least one of a contact finger, a solder pad and a through-hole on the panel.

10. A substrate panel as recited in claim 1, further comprising plating tails electrically coupled between the plating bar and the electrical terminals in the second package outline.

11. A substrate panel as recited in claim 1, wherein the electrical terminals are plated with one of gold, nickel or an alloy of gold and nickel.

12. A substrate panel for fabricating semiconductor packages, the substrate panel including a plurality of package outlines defining locations for formation of semiconductor packages, the substrate panel comprising:
   a first package outline of the plurality of package outlines, the first package outline including electrical terminals on a surface, a first edge and an second edge adjacent to the first edge;
   a second package outline of the plurality of package outlines, the second package outline including electrical terminals and being adjacent to the first edge of the first package outline so that the first and second package outlines adjoin each other at the first edge of the first package outline;
   a third package outline of the plurality of package outlines, the third package outline including electrical terminals and being adjacent to the second edge of the first package outline so that the first and third package outlines adjoin each other at the second edge of the first package outline;
   a first plating bar between the first and second package outlines, the first plating bar being electrically coupled to the electrical terminals in the first package outline and the first plating bar is not electrically coupled to the electrical terminals in the second package outline, the first plating bar being positioned between the first and second package outlines closer to the second package outline; and
   a second plating bar between the first and third package outlines, the second plating bar being electrically coupled to the electrical terminals in the first package outline and the second plating bar is not electrically coupled to the electrical terminals in the third package outline, the second plating bar being positioned between the first and third package outlines closer to the third package outline.

13. A substrate panel as recited in claim 12, wherein the first plating bar is sufficiently close to the second package to prevent electrical shorting together of two or more electrical terminals on the first package outline through the first plating bar as a result of a cutting device deviating from an intended cut line during a process for cutting the first plating bar.

14. A substrate panel as recited in claim 12, wherein the first plating bar is spaced away from the first edge approximately the same distance that the second plating bar is spaced away from the second edge.

15. A substrate panel as recited in claim 12, wherein the first plating bar is spaced away from the first edge a different distance than the second plating bar is spaced away from the second edge.

16. A substrate panel as recited in claim 12, wherein the first plating bar is more than 50 µm away from a centerline between the first and second adjacent package outlines.

17. A substrate panel as recited in claim 12, wherein the first plating bar is 25 µm or less away from the first package outline.

18. A substrate panel as recited in claim 17, wherein the kerf width between the first and second package outlines is between 100 µm and 225 µm.

19. A substrate panel as recited in claim 12, wherein the kerf width between the first and second package outlines is between 100 µm and 225 µm.

20. A substrate panel as recited in claim 12, wherein the electrical terminals are plated with one of gold, nickel or an alloy of gold and nickel.

21. A portable memory device singulated from a substrate panel, the substrate panel including first and second package outlines defining locations for formation of the portable memory device and a second portable memory device, the substrate panel comprising:
    a first package outline of the plurality of package outlines, the first package outline including electrical terminals;
    a second package outline of the plurality of package outlines, the second package outline including electrical terminals and being adjacent to the first package outline;
    a plating bar adjacent to the first package outline on a first side of the plating bar and adjacent the second package outline on a second side of the plating bar, the plating bar being electrically coupled to the electrical terminals in the first package outline and not those in the second package outline, the plating bar being positioned closer to the second package outline;
    one or more semiconductor die affixed to the substrate within the first package outline; and
    molding compound for encapsulating at least a portion of the first package outline and the one or more semiconductor die.

22. A portable memory device as recited in claim 21, wherein the electrical terminals on the first package outline include a plurality of contact fingers for removably coupling the portable memory device to a host device.

23. A portable memory device as recited in claim 21, wherein the portable memory device is an LGA device.

24. A substrate panel for fabricating semiconductor packages, the substrate panel including a plurality of package outlines defining locations for formation of semiconductor packages, the substrate panel comprising:
    a first package outline of the plurality of package outlines, the first package outline including electrical terminals;
    a second package outline of the plurality of package outlines, the second package outline including electrical terminals and being adjacent to the first package outline so as to adjoin the first package outline; and
    a plating bar positioned in a boundary region shared by and directly between the first and second package outlines, the plating bar being electrically coupled to the electrical terminals in the first package outline and not those in the second package outline, the plating bar being positioned closer to the second package outline.

25. A substrate panel as recited in claim 24, wherein the plating bar is sufficiently distant from the second package outline to prevent electrical shorting together of two or more electrical terminals through the plating bar due to tolerances in a process for cutting the coupling between the plating bar and the electrical terminals.

26. A substrate panel as recited in claim 24, wherein the electrical terminals in the first package outline are contact pads on the substrate.

27. A substrate panel as recited in claim 24, wherein the electrical terminals in the first package outline are contact fingers.

28. A substrate panel as recited in claim 24, wherein the first and second groups of electrical terminals comprise at least one of a contact finger, a solder pad and a through-hole on the panel.

29. A substrate panel as recited in claim 24, further comprising plating tails electrically coupled between the plating bar and the electrical terminals in the second package outline.

30. A substrate panel as recited in claim 24, wherein the electrical terminals are plated with one of gold, nickel or an alloy of gold and nickel.

* * * * *